US006801591B1

(12) United States Patent
Frencken

(10) Patent No.: US 6,801,591 B1
(45) Date of Patent: Oct. 5, 2004

(54) CLOCK RECOVERY

(75) Inventor: Peter Hubertus Frencken, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 714 days.

(21) Appl. No.: 09/665,629

(22) Filed: Sep. 19, 2000

(30) Foreign Application Priority Data

Sep. 21, 1999 (EP) .......................................... 99203092

(51) Int. Cl.[7] .............................................. H03D 3/74
(52) U.S. Cl. ..................................... 375/373; 375/376
(58) Field of Search ................................ 375/359, 360, 375/371, 373, 376, 348, 374, 375

(56) References Cited

U.S. PATENT DOCUMENTS

| 5,652,627 A | | 7/1997 | Allen ........................... 348/497 |
| 5,699,392 A | * | 12/1997 | Dokic .......................... 375/376 |
| 5,767,746 A | | 6/1998 | Dieterich ..................... 331/17 |
| 5,802,123 A | * | 9/1998 | Yoshimura et al. ......... 375/376 |
| 5,870,441 A | * | 2/1999 | Cotton et al. ............... 375/354 |
| 6,072,832 A | | 6/2000 | Katto .......................... 375/240 |
| 6,195,403 B1 | * | 2/2001 | Anderson et al. ........... 375/376 |
| 6,345,079 B1 | * | 2/2002 | Ohishi ......................... 375/373 |
| 6,650,721 B1 | * | 11/2003 | Janesch et al. ............. 375/376 |

FOREIGN PATENT DOCUMENTS

| EP | 0695095 A2 | 1/1996 |
| GB | 2306843 A | 5/1997 |
| JP | 10136259 | 5/1922 |

* cited by examiner

Primary Examiner—Khai Tran
Assistant Examiner—Qutbuddin Ghulamali
(74) Attorney, Agent, or Firm—Michael J. Ure

(57) ABSTRACT

An exemplary data processing device includes a clock recovery system for locking a clock frequency to time stamps (PCR) of an incoming data stream, e.g. MPEG. The exemplary device uses a free running clock (20) that generates a reference frequency (FREF) from which a desired locked clock frequency is synthesized (25,35) under control of a processing unit (24,34) that compares (241,341) the locked clock frequency to the time stamps (PCR). MPEG audio and video processing clock frequencies are synthesized (25,35) from a free running reference frequency (FREF) and locked to the MPEG time base on basis of time stamps (PCR) provided in the MPEG data stream. Other sub-systems (23,23') run on frequencies that are not locked to the time base, e.g. simple multiples (22,22') of the free running reference frequency (FREF).

10 Claims, 5 Drawing Sheets

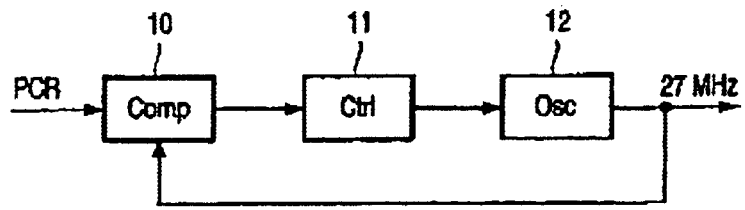
FIG. 1 [PRIOR ART]
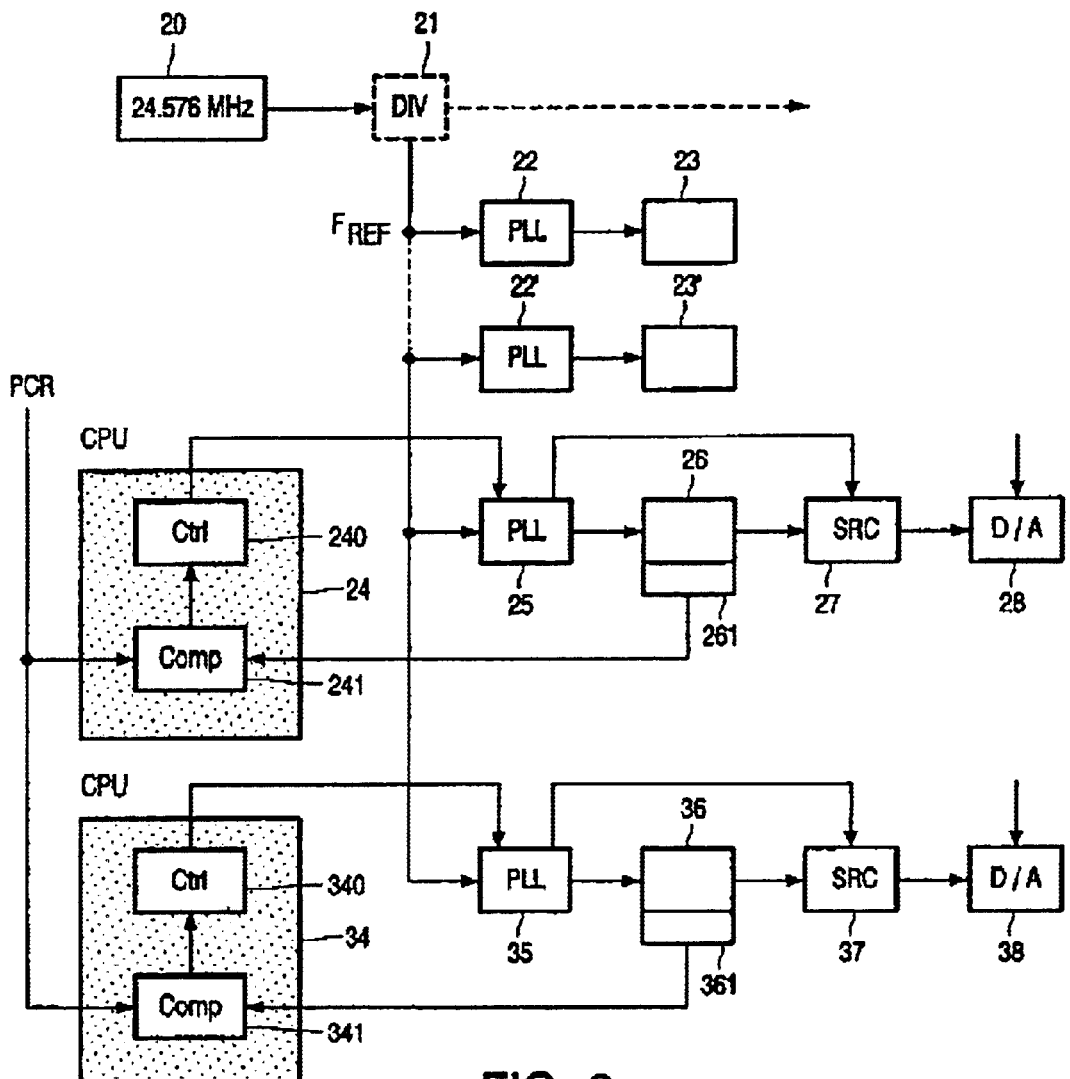
FIG. 2

CLOCK RECOVERY

The invention relates to a device for processing a data stream, the device comprising a clock recovery system for locking a clock frequency to a time base of the data stream by comparing the clock frequency to time stamps representing the time base.

The invention further relates to a method of locking a clock frequency to a time base of a data stream by comparing the clock frequency to time stamps representing the time base.

U.S. Pat. No. 5,699,392 discloses a system for the recovery of an encoder clock from an MPEG-2 transport stream. The frequency of a decoder clock is maintained at approximately the same frequency as an encoder clock, based on program clock reference (PCR) values contained in a digital information stream. A voltage-controlled oscillator produces a decoder clock frequency of 27 MHz. The decoder clock is fed back to a counter to produce a local system time clock (STC). The counter is initially loaded with a PCR value from the digital data stream. As subsequent PCR values are received, a subtractor subtracts the value of the PCR from the value of the local STC to produce an error signal. To produce a control signal, the error signal is filtered, scaled, and added to a control variable within a low-pass filter and processor. The control signal is applied to the voltage-controlled oscillator to adjust the oscillation frequency of the oscillator.

The MPEG standards provide for the transmission of digital information from multiple sources by dividing the digital data into a number of packets. The packets are then multiplexed onto a single data channel, allowing a relatively large number of users to transmit and receive data over a common data channel. All audio, video and auxiliary information to be carried within a given data channel is divided into 188-byte long transport packets. Each transport packet is subdivided into a header and a payload. The header carries information to identify the type of data that is carried within the payload and information required for decoding the transport packet stream. The PCR is a 42-bit value that represents time stamps from a relative STC that is clocked by an encoder clock within an MPEG-2 encoder. Of the 42 bits, the first 33 bits of the PCR value are referred to as the PCR base, and express a value of the encoder system time clock in 90 kHz time base units. The remaining 9 bits of the PCR value are referred to as the PCR extension, and express a value of the system time clock in 27 MHz (modulo 300) time base units. The MPEG-2 standard requires that the PCR values must be provided at intervals of no more than 100 ms in the transport stream. The PCR values within the MPEG-2 transport stream are used to accurately recover the encoder clock in the MPEG-2 decoder. It is necessary to maintain accurate synchronization between the encoder clock used to encode the data and the decoder clock used to decode the data in order to properly demultiplex and decode the audio and video data. A difference in the encoder and decoder clock frequencies causes buffer underflow or overflow.

The transport stream is provided with presentation timestamps (PTS) to indicate to the MPEG-2 decoder when to present the individual frames of video and audio data to the user. The value of each PTS is ultimately dictated by the frequency of the encoder clock in the encoder, which clocks an STC in the MPEG-2 encoder. When encoding the data, the MPEG-2 encoder inserts the PTS into the transport stream based on samples of the STC. The decoder clock in the MPEG-2 decoder must therefore operate at the same frequency as the encoder clock if the data streams are to be properly presented to a user. For purposes of this description,"synchronization" between the encoder clock and the decoder clock implies that the clocks are operating at the same frequency, but with a possible phase offset between them.

Assuming an error-free environment, synchronizing the encoder and the decoder clocks eliminates frame skips or frame holds that occur when displaying the transmitted data. A frame skip can occur when data is received later than its PTS denotes. A frame hold can occur when the buffer within the decoder receives insufficient audio or video data to perform the decoding. To maintain synchronization, a phase locked loop is provided in the clock recovery system. The voltage-controlled oscillator operates at a nominal oscillation frequency of 27 MHz and has a control input to adjust the frequency within a small range surrounding the 27 MHz nominal frequency. The decoder clock is used for demultiplexing, decoding and displaying the audio and video.

An object of the invention is, inter alia, to provide a more flexible and cost-effective clock recovery system. To this end, the invention provides a data processing device and a method of locking a clock frequency to a time base of a data stream as defined in the independent claims. Advantageous embodiments are defined in the dependent claims.

A first embodiment of the invention is characterized in that said clock recovery system comprises: a free running clock for generating a free running reference frequency; and means for synthesizing said clock frequency from said reference frequency under control of said time stamps. A free running clock is more cost-effective than a de-tunable crystal as is used in embodiments that are known from the prior art. Faster locking and a larger tracking range can be achieved. The invention further offers more flexibility in choosing another frequency.

An embodiment of the invention comprises further means for synthesizing a further clock frequency from said reference frequency without locking to said time base. A further clock frequency for which locking to the time base of the incoming data stream is not necessary, is generated from the free running reference frequency, for example by a dedicated phase locked loop. This embodiment provides a clock system that provides locked clocks as well as unlocked clocks. The free running reference frequency is used for both types of clocks as a reference clock. Locking is only performed for those clocks that really need locking, e.g. clocks for use in MPEG audio and video processing units. In a practical embodiment of the invention, said further means comprise a multiplier for multiplying said reference frequency by an appropriate integer number to obtain said further clock frequency. If such a multiplier is implemented by use of a phase locked loop, integer dividers are required, thus simplifying the design. Clock skew, due to different load of the individual clock trees, between various blocks is minimized and data can be exchanged without additional synchronization circuitry.

In a further embodiment of the invention, said synthesizing means comprise a controlled multiplier for multiplying the reference frequency by an appropriate number to obtain said clock frequency, said appropriate number being derived under control of said time stamps. For flexibility, the appropriate number is made controllable by a processing unit. Locking to the time base of the incoming data stream is achieved by comparing the locked clock frequency with the incoming time stamps and to calculate the appropriate number by the processing unit.

In a practical embodiment, the controlled multiplier comprises a phase locked loop (PLL) circuit for obtaining an oscillation frequency at an integer multiple of the reference frequency, said circuit comprising a phase detector coupled to an oscillator, and a feedback loop for feeding the oscillation frequency to an input of the phase detector, said feedback loop comprising an integer divider; and a controlled divider for dividing the oscillation frequency by a non-integer divider number to obtain a divided frequency, said divider number being derived under control of said time stamps and said divided frequency being output as the clock frequency. This is a practical implementation of the invention, in which the feedback loop only needs a simple integer divider. Since this straight forward implementation of the synthesizing means for locking the clock frequency by the use of a phase locked loop does not minimize clock jitter and clock skew, some special measures are defined in further embodiments.

In a clock skew reducing embodiment of the invention, said controlled multiplier comprises: a phase locked loop circuit for obtaining an oscillation frequency at an integer multiple of the reference frequency, said circuit comprising a phase detector coupled to an oscillator; a controlled divider for dividing the oscillation frequency by a non-integer divider number to obtain a divided frequency, said divider number being derived under control of said time stamps; a counter for counting the number of positive edges in the divided frequency per cycle of the reference frequency; means for generating a predetermined frequency comprising an amount of positive edges at predetermined positions, said amount being equal to said number of positive edges in the divided frequency and said predetermined frequency being output as the clock frequency; and a feedback loop for feeding the clock frequency to an input of the phase detector, said feedback loop comprising an cascaded divider being arranged to divide the clock frequency by a divider number equal to said number of positive edges.

An advantageous embodiment of the invention comprises means for synthesizing clock frequencies for audio processing and video processing independently. Locking the audio and video clocks independently has the additional advantage that even PTS time stamps can be involved in the regulation by which an exact time base match can be achieved. Also time base discontinuities can be optimized independently.

A further embodiment comprises first processing means for performing a first processing step with use of said clock frequency; second processing means for performing a second processing step with use of said further clock frequency; and a sample rate converter for converting a sample rate of an output signal of the first processing means to furnish converted output signals to the second processing means. This embodiment provides a solution for coupling a unit that runs on a locked clock frequency and a second unit that runs on an unlocked, i.e. a different frequency. The sample rate converters compensate for the clock jitter, so that no difficult high performance analog PLL's are required. This embodiment is especially useful for running audio and video processing units on a locked clock frequency and digital to analog converters coupled to the processing units on an unlocked clock frequency. In an advantageous embodiment, the D/A converter for the video part runs at an integer multiple of the clock frequency of the audio D/A converter. This integer can be equal to one, so that the audio and video D/A converters run at the same clock frequency. The same clock frequency or a simple mutual clock ratio for audio and video D/A converters simplifies the integration on the same chip. The sample rate converter may be controlled by phase information out of the controlled multiplier.

The aforementioned and other aspects of the invention will be apparent from and elucidated with reference to the embodiments described hereinafter.

In the drawings:

FIG. 1 shows a schematic overview of a clock recovery system as known from he prior art;

FIG. 2 shows a device for processing a data stream, comprising several aspects of the invention;

Figure 3:
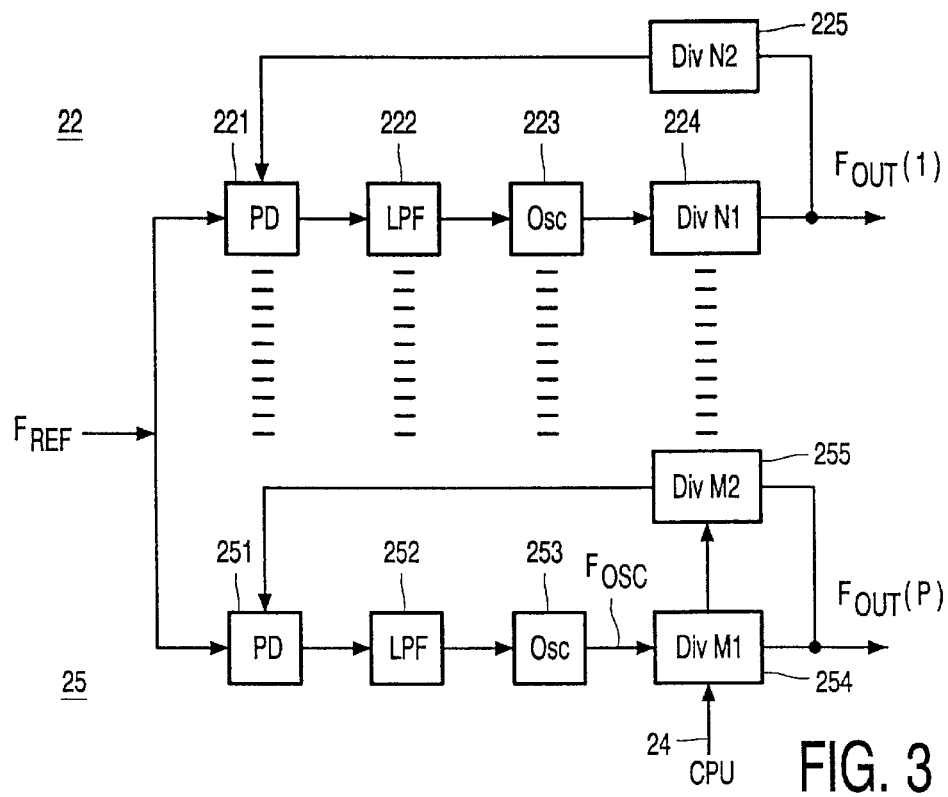
FIG. 3 shows a generalized block diagram of PLL clock synthesizing according to the invention.

The drawings only show those elements that are necessary to understand the invention.

The clock recovery system of FIG. 1 schematically shows a system as is known from the prior art. This system comprises a comparator 10, a control unit 11 and an oscillator 12. The oscillator is controllable by the control unit 11. The output of the oscillator is about 27 MHz, which is fed back to the comparator 10. The output frequency of 27 MHz is de-tunable within a small range of approximately 100 ppm. The comparator 10 compares the clock frequency with the incoming time stamps PCR. Based on the comparison performed in the comparator, the frequency of the oscillator is adjusted. The 27 MHz frequency is used as a clock frequency in the decoder. The conventional 27 MHz is only optimized for standard ITU656 based video. For other integrated functions like audio decoding, graphics overlay, CPU, peripherals etc. other clocks might be more optimal. Hence many different PLL's or multiple crystals would be required in such systems which complicates the design considerably. The audio part requires a low jitter clock at a multiple of the audio sampling frequency. Here, an additional non-integer divider plus a high performance PLL would be necessary with the disadvantage that the clock skew with the other clock domains is unknown. Moreover it is very difficult to meet the very demanding requirements on clock jitter for the audio D/A converters.

A data processing device according to the invention is shown in FIG. 2. Although the invention is applicable to any data stream comprising time stamps, the following discussion will concentrate on an MPEG encoded data stream.

The device comprises a free running clock 20 that produces an exemplary free running frequency of 24.576 MHz. This is a practical frequency for a DVB set top box. Dependent on the specific application another frequency might be more practical. A practical frequency for a TV is e.g. 24.0 MHz.

A frequency divider 21 is an optional element that can be used to divide the frequency of the free running clock 20. The frequency divider 21 can be part of the free running clock and may also be omitted. In the following discussion the frequency divider 21 is assumed to be present and to divide the frequency of the free running clock 20 by 4 to obtain a free running reference frequency $F_{REF}$ of 6.144 MHz. This single low reference frequency FREF is distributed over the device. The free running frequency generated by the free running clock 20 or a derivative thereof, is optionally output to an external device or communication bus, for example external SDRAM, an IEEE1394 interface or a modem. If the divider 21 is omitted, the reference frequency FREF is equal to the frequency as generated by the free running clock 20.

The device comprises PLL's 22 and 22', which generate local frequencies for the sub-system units 23 and 23' respectively. The units 23 and 23' perform some processing function. Examples of sub-system units 23 and 23' are, among others: memory interfaces, central processing units (CPU's), peripherals, decoders, etc.

Time stamps PCR, as known from the art, represent a time base of an incoming data stream. According to a first aspect of the invention, a clock that needs locking to the time base is synthesized from the reference frequency $F_{REF}$ under control of the time stamps PCR. MPEG presentation units, for example, need clock frequencies that are locked to the time base of the incoming data stream. For locking an MPEG video processing clock frequency to the time stamps PCR, the device comprises a CPU 24 and a controlled multiplier 25 (PLL). Locking to the time base of the incoming data stream is achieved by comparing the video time base, i.e. the video processing clock frequency with the incoming time stamps PCR and to calculate an appropriate multiplying factor by the CPU 24. Practically, the CPU 24 calculates appropriate divider numbers for non-integer dividers that are used in the PLL that forms the controlled multiplier 25 as will be discussed in relation to FIG. 3. The CPU 24 comprises a compare unit 241 and a control unit 240. The video processing clock frequency is output from the PLL 25 to a video processing unit 26. Coupled to the video-processing unit 26 is a video time counter 261. The video time counter 261 is used to divide and feed back the required video time base to the compare unit 241 in the CPU 24.

The audio part of the device is implemented in a similar way and comprises a CPU 34 comprising a compare unit 341 and a control unit 340. The audio part further comprises a controlled multiplier 35 (PLL) and an audio processing unit 36 coupled to an audio time counter 361. The elements in the audio part are similar to their counterpart in the video part of the device.

Doing the time base regulation for the audio and video parts of the device independently, has the additional advantage that time base discontinuities can be optimized individually. Furthermore, decoding and presentation time stamps can be involved in the regulation so that an exact time base match can be achieved. MPEG-2 decoding and presentation time stamps are described in U.S. Pat. No. 5,652,627. A presentation time stamp (PTS) specifies the time at which each picture is to be displayed, and a decode time stamp (DTS) specifies the time at which a picture is to be decoded when the decoding time differs from the presentation time. Each MPEG-2 picture and audio frame is tagged (explicitly or implicitly) with a DTS, which indicates the time of the decoder clock at which the picture or audio frame should be decoded. If a DTS for a particular picture or audio frame is not explicitly coded in the MPEG-2 bit stream, then that picture or audio frame is decoded immediately following the previous one. Both pictures and audio frames are transmitted in order of increasing DTS value. Because MPEG-2 requires some pictures to be transmitted several pictures earlier in sequence than they are to be shown (i.e. prior to a B-picture), these pictures also require a second time stamp called the presentation time stamp (PTS) which indicates the clock value at which the picture is intended to be shown. If only a single time stamp is coded (as is always the case with audio), it is assumed to be both the DTS and PTS. Beginning both the video and audio at the time indicated in their respective PTS fields ensures synchronization (lip sync) of the audio and video. Locking to DTS can be done in a similar way as locking PTS.

A practical frequency for the video part is 27 MHz. Practical frequencies for the audio part are 24.6 or 22.6 MHz, i.e. a multiple of the audio sampling frequency. The clock system of FIG. 2 provides locked and unlocked clocks with crystal stability.

In an embodiment of the invention, video and audio digital to analog (D/A) converters 28 and 38 run on a frequency that is derived from the free running reference frequency $F_{REF}$ without locking to the time base of the incoming data stream. In a practical embodiment, PLL's similar to the PLL's 22 and 22' are used. It is however also possible to derive the clock frequencies for the D/A converters 28 and 38 in an alternative way. For integration on a single Integrated Circuit (IC) it is profitable to run the D/A converters 28, 38 on a simple mutual clock ratio or on the same clock frequency, e.g. running the video D/A converter 28 on an integer multiple of the audio D/A converter 38 clock frequency.

FIG. 3 shows a generalized block diagram of PLL clock synthesizing according to the invention. In general, a PLL is a closed loop frequency control system which functioning is based on phase sensitive detection of phase difference between an input signal and an output signal of a controlled oscillator. The PLL controls the oscillator so that it maintains a constant phase angle relative to a reference signal.

FIG. 3 shows the PLL 22, which does not lock the clock frequency to the time base of the incoming data stream and the PLL 25 that generates the video presentation clock, which is locked to the time base of the incoming data stream. The PLL 22' and the PLL 35 are similar to the PLL 22 and the PLL 25, respectively.

The PLL 22 comprises a phase detector 221 (PD), a loop filter 222 (LPF), a controlled oscillator 223 (Osc), a first divider 224 (DivN1), and a second divider 225 (DivN2) being placed in a feedback loop. In this embodiment, the unlocked further clock frequencies that are used in the sub-systems are integer multiples of the free running reference frequency $F_{REF}$. The dividers 224, 225 are therefore simple, integer dividers. The oscillator 223 generates a frequency that is an integer multiple of the reference frequency $F_{REF}$. The frequency of the oscillator 223 is thereafter divided in the first divider 224 by an integer number N1 to generate the further clock frequency $F_{OUT}(1)$ that is used in the sub-system 23. The further clock frequency $F_{OUT}(1)$ is fed back to the phase detector 221 after dividing by a second integer number N2 in the second divider 225 to make comparison with the reference frequency $F_{REF}$ possible. This is necessary because the further clock frequency $F_{OUT}(1)$ is an integer multiple of the reference frequency $F_{REF}$. Depending on the phase difference detected in the phase detector 221, the generated frequency of the controlled oscillator 223 is amended by use of the loop filter 222 to keep a constant phase angle between the further clock frequency $F_{OUT}(1)$ and the reference frequency $F_{REF}$.

Figure 4A:
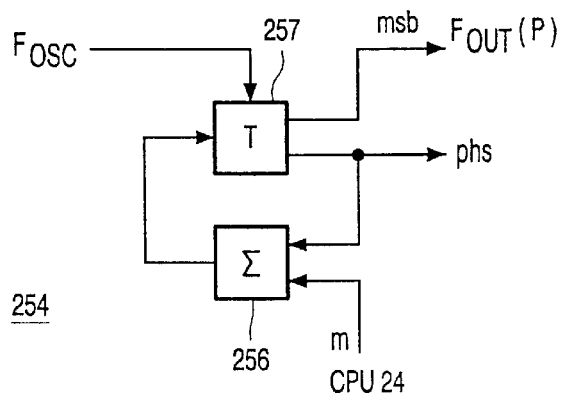
FIGS. 4A and 4B show a diagram of a non-integer divider and a corresponding timing diagram.

THE PLL 25 comprises a phase detector 251, a loop filter 252, an oscillator 253, a first divider 254 (DivM1) and a second divider 255 (DivM2). As in the PLL 22, the free running reference frequency $F_{REF}$ is used as a reference. However, for generating a locked clock frequency $F_{OUT}(P)$ for MPEG time base related blocks, it is required that the divider 254 is a non-integer divider dividing by a non-integer divider number M1. For flexibility, the non-integer divider number M1 is made controllable by the CPU 24. In general, the non-integer divider 254 can be implemented as shown in FIG. 4A. The non-integer divider 254 comprises an accumulator 256 and a feedback register 257. Such a divider is also called a discrete time oscillator or a numerically controlled oscillator. The register 257 receives the frequency $F_{OSC}$ that has been generated by the oscillator 253. In an exemplary embodiment, $F_{OSC}$ is 73.728 MHz having a width of 22 bits. The divider 254 divides the oscillation frequency to the desired locked frequency of 27 MHz. The most significant bit msb, of the 23-bit output of the register 257 represents the output frequency $F_{OUT}$. The remaining 22-bit output of the register 257 is fed back to the accumulator 256. The accumulator 256 further receives a 22-bit number m that is obtained from the CPU 24. The feedback signal and the number m are accumulated in the accumulator 256 and thereafter transmitted as a 23-bit number to the register 257. $F_{OUT}$ is equal to m times $73,728,000/2^{22}$, i.e. m times 17.6 Hz. For an output frequency $F_{OUT}$ of 27.0 MHz, the number m should be 1,536,000. This number m is calculated in the CPU under control of the time stamps PCR as described above and represents the divider-number M1. The regulation accuracy of the illustrated 22-bit implementation is 0.65 ppm (17.6/27,000,000). If a higher accuracy for the output frequency $F_{OUT}$ is required, the data path in the feedback loop has to be widened by one bit for every factor 2. It should be noted that the data in the feedback loop represents the phase relation phs between $F_{OUT}$ and $F_{OSC}$.

Figure 4B:
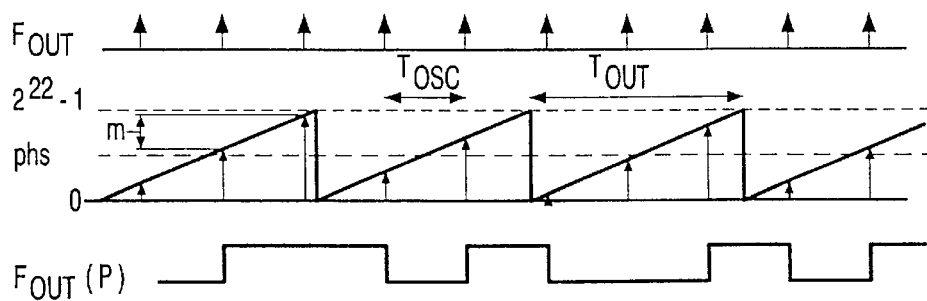

FIG. 4b shows a timing diagram of the non-integer divider 254. Edges $F_{OUT}$ will coincide with edges of $F_{OSC}$. Since the ratio between $F_{OUT}$ and $F_{OSC}$ is non-integer, the distance between two successive output pulses will switch between the two adjacent integer values. In the example of 27 MHz output, the distance will be alternating between 2 and 3 such that the average value equals the divider number 73.278/27=2.73. The output will therefore exhibit a jitter of $\pm 0.5\ T_{OSC}$.

Because the divider number M1 is non-integer, a non-integer relationship exists between $F_{OUT}$ and $F_{REF}$. There are several possibilities to implement the desired feedback of $F_{OUT}$ to the phase detector.

Figure 5:
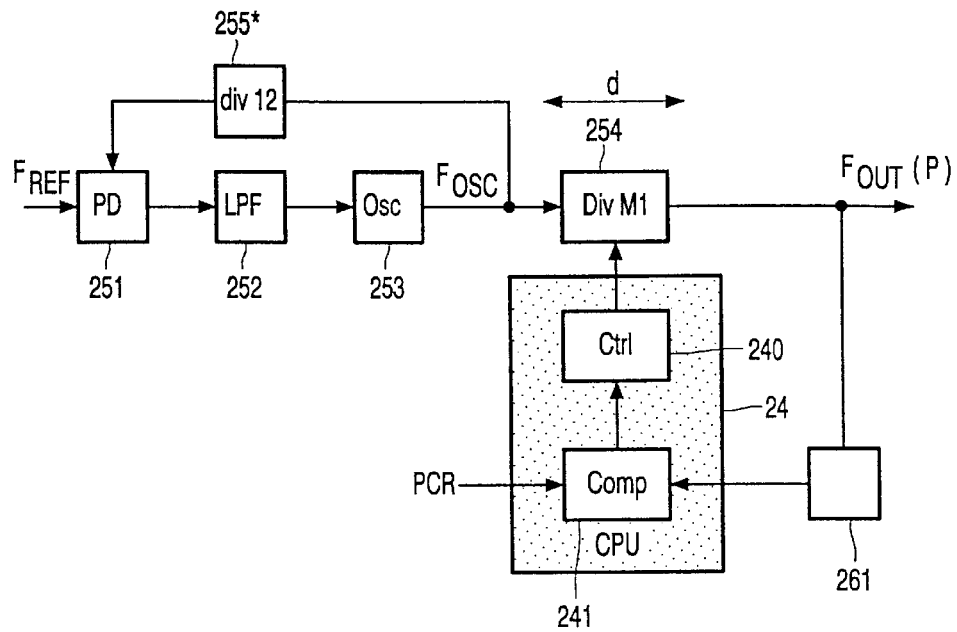
FIG. 5 shows a further embodiment of a locked clock according to the invention.

FIG. 5 shows a practical implementation of a locked clock generator with a non-integer divider 254. The frequency $F_{OUT}(P)$ is locked to the MPEG time base via the CPU controlled divider 254. The oscillation frequency $F_{OSC}$ is fed back to the phase detector 251 via a divider 255* rather than the output frequency $F_{OUT}$. An advantage of this embodiment is that the divider 255* can be implemented as a simple integer divider, because $F_{OSC}$ is an integer multiple of $F_{REF}$. Due to the unknown load in an MPEG clock tree, the delay d of the divider 254, i.e. the relation with $F_{REF}$ is lost. In this embodiment, clock skew and clock jitter are not minimized.

In advantageous embodiments of the invention, solutions are proposed to minimize clock jitter and clock skew.

Clock jitter in the embodiment of FIG. 5 can be reduced by increasing the oscillation frequency $F_{OSC}$, e.g. by a factor 4 to 294.9 MHz. An advantage thereof is that the design of the digital part is simplified. A disadvantage is that the clock requirements for the D/A converter 28 might not be satisfied. Also post-PLL's as in the existing implementation for audio will have their limitation in signal quality.

Figure 6:
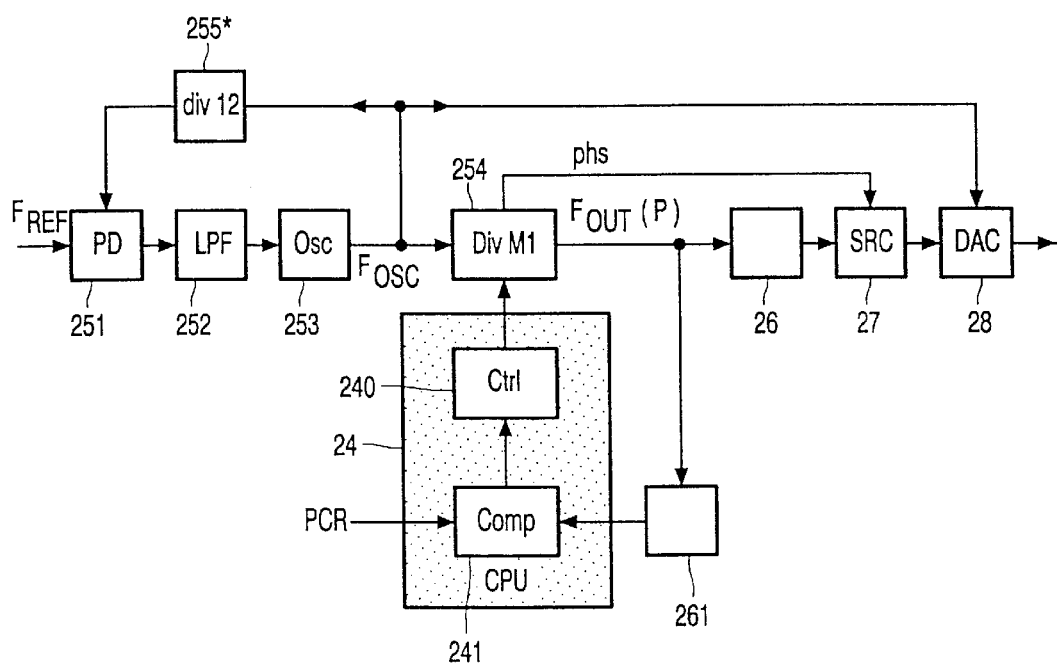
FIG. 6 shows an embodiment of the invention for compensation of clock jitter.

FIG. 6 shows an embodiment for compensating clock jitter in an advantageous manner. The D/A converter 28 runs on a frequency that is derived from the reference frequency $F_{REF}$ without locking to the MPEG time base, which frequency has a low jitter. In the illustrating embodiment of FIG. 6, the D/A converter 28 runs on $F_{OSC}$ which is in fact an unlocked integer multiple of the reference frequency $F_{REF}$. The feedback in the PLL is performed by the divider 255*, in the same way as already discussed in relation to FIG. 5. A sample rate converter 27 (SRC) is used in the signal path for converting the sample rate of the output signal of the video-processing unit 26 to furnish a converted video stream to the D/A converter 28. This is necessary because the D/A converter 28 runs on a different frequency than the video-processing unit 26 that runs on the locked clock frequency $F_{OUT}(P)$. Although a D/A converter is discussed, it should be mentioned that according to the invention any processing unit, which runs on an unlocked frequency and is coupled to another unit that runs on a locked frequency, could be used with a sample rate converter to convert the sample rate of the signal. The sample rate converter 27 can be controlled by phase information phs out of the non-integer divider 254.

This foregoing approach is used for both audio and video. The additional advantage is that the audio and video D/A converters 28, 38 can run on the same clock frequency or on different clock frequencies having a simple mutual ratio, e.g. an integer number, which simplifies the integration of both converters on the same chip significantly.

Figure 7A:
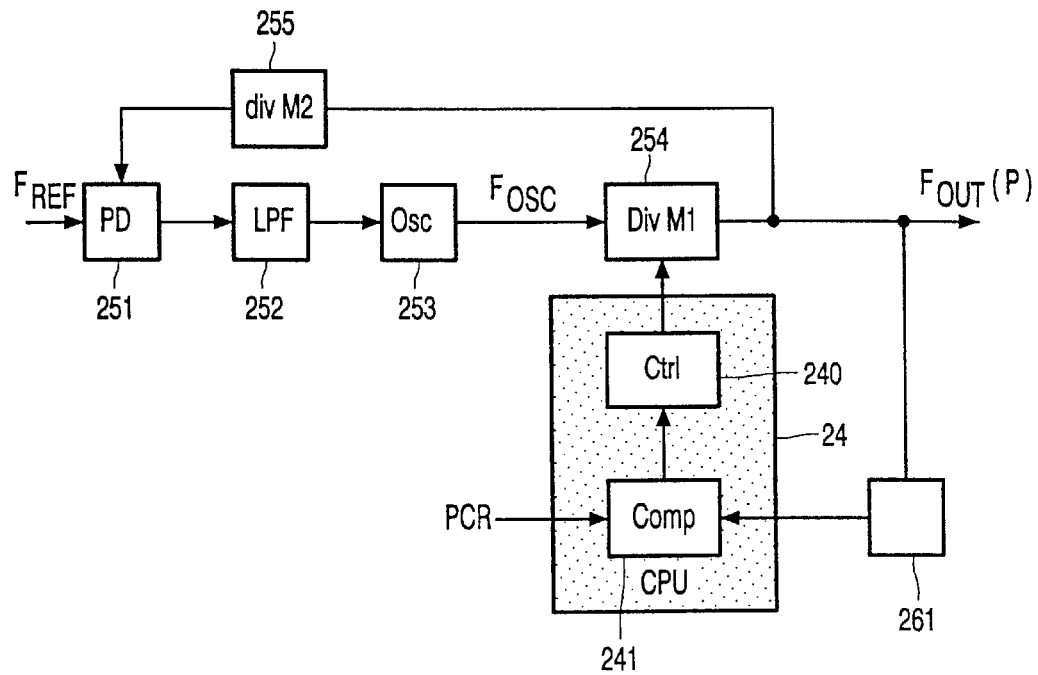
FIGS. 7A and 7B show an embodiment of the invention for compensation of clock skew and a corresponding timing diagram.
Figure 7B:
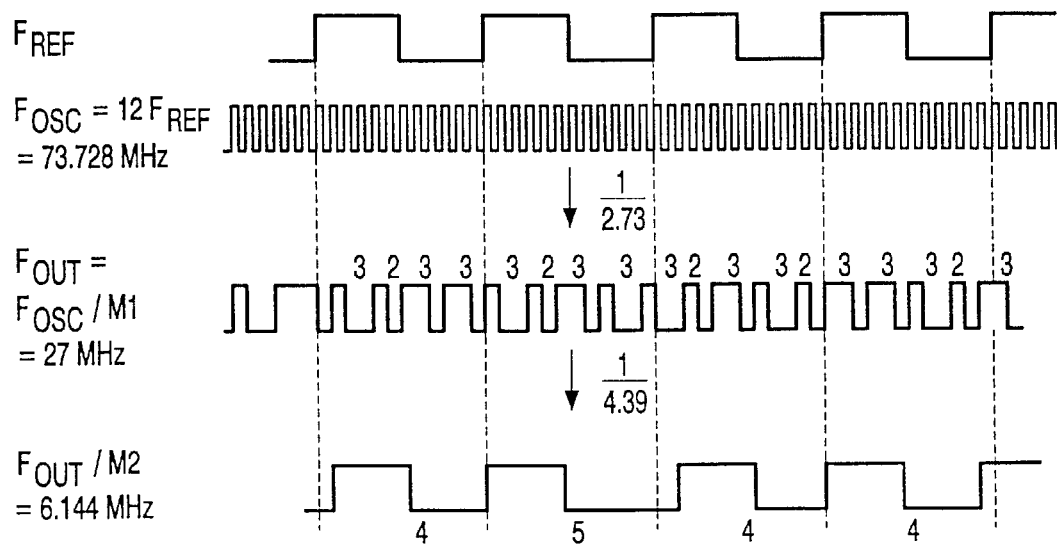

Reduction of clock skew can be achieved by introducing a feedback loop from $F_{OUT}(P)$ to $F_{REF}$ as shown in FIG. 7A. This is in conformity with the non-integer PLLs as shown in FIG. 3. The main difference between the embodiments shown in FIGS. 5 and 7A is that the divider 255 in the feedback loop as shown in FIG. 7A needs to be a non-integer divider, instead of a integer divider. The divider 255 can be implemented similar to the non-integer divider 254. A timing diagram of the embodiment of FIG. 7A is shown in FIG. 7B. The non-integer divider number M2 is equal to 4.39 (27.0/6.144). As can be seen, $F_{OUT}$ exhibits in this embodiment clock jitter with reference to $F_{REF}$. Additional measures are proposed to minimize this clock jitter.

Figure 8A:
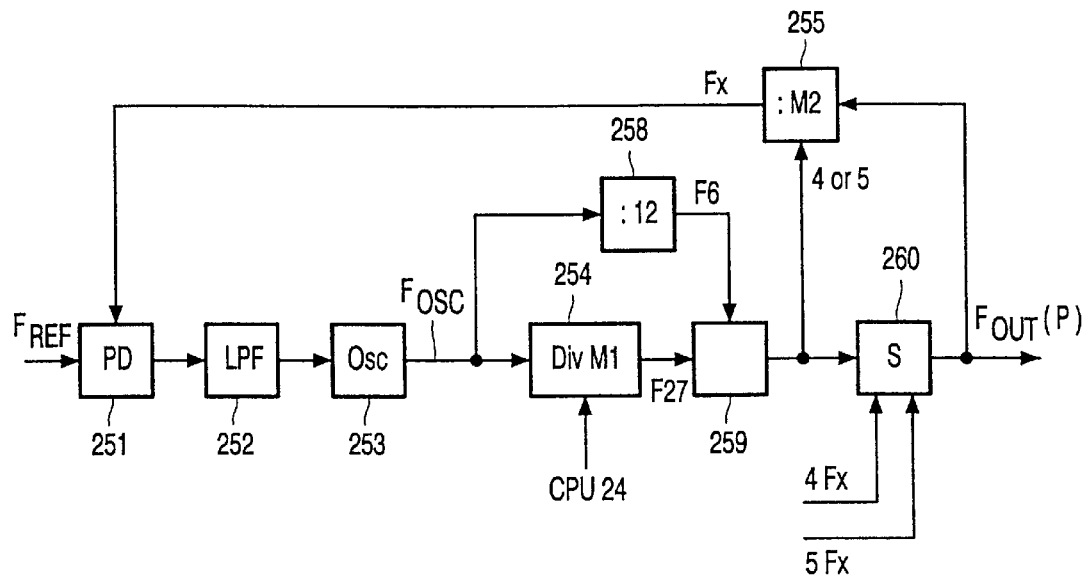
FIGS. 8A and 8B show a PLL with non-integer dividers according to the invention and a corresponding timing diagram.
Figure 8B:
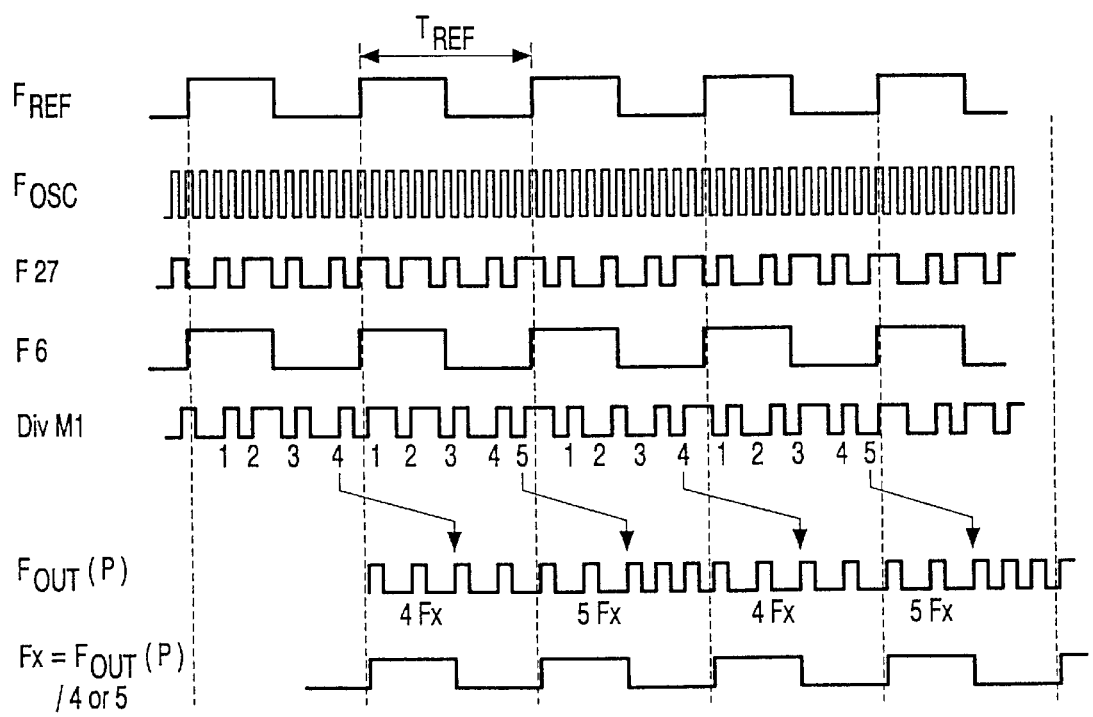

An illustration of an embodiment comprising these additional measures is shown in FIG. 8a. The non-integer divider 254 is the same as described above. This divider converts the $F_{OSC}$ of 72.728 MHz to $F_{OUT}(P)$, being 27.0 MHz and locked to the MPEG time base. The number of positive edges in each $F_{REF}$ cycle $T_{REF}$ is counted in edge counter 259. For $F_{OSC}$ is 72.728 MHz and $F_{OUT}(P)$ is 27.0 MHz, the number of positive edges will be 4 or 5, because 27.0/6.144 is 4.73. The edge counter 259 uses $F_{OSC}$ being divided by 12 in divider 258 as representation of $F_{REF}$. The output of the edge counter 259 is the number of counted positive edges, being 4 or 5 in this implementation. With this information, $F_{OUT}(P)$ is generated with exactly the same number of positive edges for a $F_{REF}$ cycle, but at predetermined positions. The embodiment therefore comprises a selector 260 that selects a predetermined sequence 4Fx or 5Fx, depending on the number of positive edges counted for output, as $F_{OUT}(P)$. The divider 255 is being arranged as a cascaded divider, bringing down $F_{OUT}(P)$ to 6.144 MHz by switching between two integer numbers depending on the counted number of positive edges as provided by the edge counter. The resulting frequency $F_x$ has the proper frequency and no jitter compared to $F_{REF}$. The frequency $F_x$ can therefore be used in the phase detector. The phase relation between $F_{OUT}$ and $F_{REF}$ is only determined by the delay of the divider 255. In this way, independence of clock tree load is achieved, resulting in a minimized clock skew with other domains, even with clock frequencies that have integer relationships with $F_{REF}$. The invention thus provides clocks that have crystal stability, exhibit low clock skew and are controllable over a large frequency range.

The same mechanism can be used for the generation of the clock frequency for the audio part, where the clock frequency is either 24.6 or 22.6 MHz. Also here the number of clocks per reference clock cycle $T_{REF}$ is between 4 and 5. Only the switching will occur at a different ratio in order to achieve the proper output frequency value.

The mechanism of clock edge permutation is only effective in the digital domain and does not change the average frequency. The sample rate converters 27, 37 in front of the D/A converters 28, 38 do not require any modification, although required buffering may need to be enlarged by one sample.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The invention can be implemented by means of hardware comprising several distinct elements, and by means of a suitably programmed computer. In a device claim enumerating several means, several of these means can be embodied by one and the same item of hardware.

In summary, the invention relates to a data processing device having a clock recovery system for locking a clock frequency to time stamps of an incoming data stream, e.g. MPEG. It has been proposed to use a free running clock that generates a reference frequency from which a desired locked clock frequency is synthesized under control of a processing unit that compares the locked clock frequency to the time stamps. The invention provides a cost effective and flexible system. MPEG audio and video processing clock frequencies are synthesized from a free running reference frequency and locked to the MPEG time base on basis of time stamps provided in the MPEG data stream. Other sub-systems run on clock frequencies that are not locked to the time base, e.g. simple multiples of the free running reference frequency. Audio and video D/A converters run on the same clock frequency or on two different clock frequencies having a simple mutual ratio that are synthesized from the free running reference frequency without locking to the time base. Sample rate converters are present in the signal path to adjust the output signal of a processing unit to the input of the D/A converter. Time base regulation for audio and video is performed independently.

What is claimed is:

1. A device for processing a data stream, the device comprising a clock recovery system for locking a clock frequency to a time base of the data stream by comparing the clock frequency ($F_{OUT}(P)$) to time stamps (PCR) representing the time base, characterized in that said clock recovery system comprises:

a free running clock (20) for generating a free running reference frequency ($F_{REF}$); and means (24,25,34,35) for synthesizing said clock frequency from said reference frequency ($F_{REF}$) under control (24,25) of said time stamps (PCR); and wherein said clock recovery system comprises further means (22,22') for synthesizing a further clock frequency ($F_{OUT}(1)$) from said reference frequency ($F_{REF}$) without locking to said time base.

2. A device as claimed in claim 1, wherein said further means (22,22') comprise a multiplier (22,22') for multiplying said reference frequency by an appropriate integer number to obtain said further clock frequency comparing the clock frequency ($F_{OUT}(1)$).

3. A device as claimed in claim 1, comprising:

first processing means (26,36) for performing a first processing step with use of said clock frequency;

second processing means (28, 38) for performing a second processing step with use of said further clock frequency; and a sample rate converter (27,37) for converting a sample rate of an output signal of the first processing means to furnish converted output signals to the second processing means.

4. A device as claimed in claim 3, wherein said synthesizing means (24,25,34,35) comprise a controlled multiplier (25,35) for multiplying the reference frequency ($F_{REF}$) by an appropriate number to obtain said clock frequency ($F_{OUT}(P)$), said appropriate number being derived under control (24,34) of said time stamps (PCR); and wherein the sample rate converter (27,37) has a control input for receiving phase information (phs) out of the controlled multiplier (25,35).

5. A device for processing a data stream, the device comprising a clock recovery system for locking a clock frequency to a time base of the data stream by comparing the clock frequency ($F_{OUT}(P)$) to time stamps (PCR) representing the time base, characterized in that said clock recovery system comprises:

a free running clock (20) for generating a free running reference frequency ($F_{REF}$); and means (24,25,34,35) for synthesizing said clock frequency from said reference frequency ($F_{REF}$) under control (24,25) of said time stamps (PCR); and wherein said synthesizing means (24,25,34,35) comprise a controlled multiplier (25,35) for multiplying the reference frequency(FUF) by an appropriate number to obtain said clock frequency ($F_{OUT}(P)$), said appropriate number being derived under control (24,34) of said time stamps (PCR).

6. A device as claimed in claim 5, wherein said controlled multiplier (25,35) comprises:

a phase locked loop circuit for obtaining an oscillation frequency ($F_{OSC}$) at an integer multiple of the reference frequency ($F_{REF}$), said circuit comprising a phase detector (251) coupled to an oscillator (253), and a feedback loop for feeding the oscillation frequency ($F_{OSC}$) to an input of the phase detector(251), said feedback loop comprising an integer divider (255*); and a controlled divider (254) for dividing the oscillation frequency (Fosc) by a non-integer divider number(M1) to obtain the clock frequency ($F_{OUT}(P)$), said divider number(M1) being derived under control (24) of said time stamps (PCR).

7. A device as claimed in claim 5, wherein said controlled multiplier (25) comprises:

a phase locked loop circuit for obtaining an oscillation frequency (Fosc) at an integer multiple of the reference frequency ($F_{REF}$), said circuit comprising a phase detector(251) coupled to an oscillator (253);

a controlled divider (254) for dividing the oscillation frequency (Fosc) by a non-integer divider number(M1)

to obtain a divided frequency($F27$), said divider number($M1$) being derived under control (24) of said time stamps (PCR);

a counter (259) for counting the number of positive edges in the divided frequency($F27$) per cycle ($T_{REF}$) of the reference frequency($F_{REF}$, $F6$);

means (258) for generating a predetermined frequency ($4Fx$, $5Fx$) comprising an amount of positive edges at predetermined positions, said amount being equal to said number of positive edges in the divided frequency ($F27$) and said predetermined frequency($4Fx$, $5Fx$) being output as the clock frequency ($F_{OUT}(P)$); and a feedback loop for feeding the clock frequency ($F_{OUT}(P)$) to an input of the phase detector(251), said feedback loop comprising a cascaded divider(255) being arranged to divide the clock frequency ($F_{OUT}(P)$) by a divider number (4 or 5) equal to said number of positive edges.

8. A device for processing a data stream, the device comprising a clock recovery system for locking a clock frequency to a time base of the data stream by comparing the clock frequency ($F_{OUT}(P)$) to time stamps (PCR) representing the time base, characterized in that said clock recovery system comprises:

a free running clock (20) for generating a free running reference frequency ($F_{REF}$); and means (24,25,34,35) for synthesizing said clock frequency from said reference frequency ($F_{REF}$) under control (24,25) of said time stamps (PCR); and wherein said data stream comprises a video stream and an audio stream, characterized in that the clock recovery system comprises:

first means (24,25) for synthesizing a video clock frequency for use in means (26) for processing the video stream; and second means (34,35) for synthesizing an audio clock frequency for use in means (36) for processing the audio stream.

9. A device as claimed in claim 8, further comprising:

a first digital to analog converter (28) suitable for running on a first free running clock frequency;

a second digital to analog converter (38) suitable for running on a second free running clock frequency;

a first sample rate converter (27) for converting a sample rate of an output signal of the means (26) for processing the video stream to furnish a converted video stream to the first digital to analog converter (28);

a second sample rate converter (37) for converting a sample rate of an output signal of the means (36) for processing the audio stream to furnish a converted audio stream to the second digital to analog converter (38).

10. A device as claimed in claim 9, wherein the second free running clock frequency is an integer multiple of the first free running clock frequency.

* * * * *